(12) United States Patent
Tabuchi et al.

(10) Patent No.: US 10,692,721 B2
(45) Date of Patent: Jun. 23, 2020

(54) WAFER PROCESSING METHOD FOR REFORMING PROTECTIVE FILM

(71) Applicant: DISCO CORPORATION, Tokyo (JP)

(72) Inventors: Tomotaka Tabuchi, Tokyo (JP); Lynne Tseng, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 73 days.

(21) Appl. No.: 15/839,226

(22) Filed: Dec. 12, 2017

(65) Prior Publication Data
US 2018/0166282 A1 Jun. 14, 2018

(30) Foreign Application Priority Data
Dec. 12, 2016 (JP) ................. 2016-240301

(51) Int. Cl.
*H01L 21/268* (2006.01)
*H01L 21/78* (2006.01)
(Continued)

(52) U.S. Cl.
CPC ............ *H01L 21/268* (2013.01); *B24B 27/06* (2013.01); *B28D 5/0011* (2013.01); *H01L 21/3081* (2013.01); *H01L 21/67092* (2013.01); *H01L 21/67132* (2013.01); *H01L 21/76* (2013.01); *H01L 21/78* (2013.01); *H01L 22/20* (2013.01);
(Continued)

(58) Field of Classification Search
CPC ............ H01L 21/268; H01L 21/02071; H01L 21/3081; H01L 21/56; H01L 21/67023; H01L 21/67092; H01L 21/67132; H01L 21/67167; H01L 21/67207; H01L 21/67745; H01L 21/6836; H01L 21/76; H01L 21/78; H01L 22/20; H01L 22/12; H01L 2221/68327; B24B 27/06; B28D 5/0011
See application file for complete search history.

(56) References Cited

U.S. PATENT DOCUMENTS 5,435,876 A * 7/1995 Alfaro ................... H01L 21/302
156/247
5,527,744 A * 6/1996 Mignardi ............ B28D 5/0011
148/DIG. 28
(Continued)

FOREIGN PATENT DOCUMENTS

| JP | 2010089109 | * | 4/2010 | ............ B23K 26/38 |
| JP | 2015-079790 | | 4/2015 | |
| JP | 2015065386 | * | 4/2015 | ........... H01L 21/301 |

*Primary Examiner* — Michael D Masinick
(74) *Attorney, Agent, or Firm* — Greer Burns & Crain Ltd.

(57) ABSTRACT

Disclosed herein is a wafer processing method including a protective film forming step of forming a protective film with which the whole of a surface of a wafer is coated, a laser beam irradiation step of irradiating the wafer with a laser beam along streets to remove a functional layer and expose a substrate, a protective film detecting step of detecting the coating state of the protective film in plural device regions over the wafer after the laser beam irradiation, a protective film re-forming step of forming the protective film again in such a manner that the protective film covers each device region if a part that is not coated with the protective film exists in the device regions, a plasma irradiation step of carrying out plasma irradiation for the wafer, and a dividing step of dividing the wafer by cutting along the streets.

8 Claims, 4 Drawing Sheets

(51) Int. Cl.
  *B24B 27/06* (2006.01)
  *H01L 21/76* (2006.01)
  *B28D 5/00* (2006.01)
  *H01L 21/66* (2006.01)
  *H01L 21/308* (2006.01)
  *H01L 21/67* (2006.01)
  *H01L 21/683* (2006.01)

(52) U.S. Cl.
  CPC .......... *H01L 21/6836* (2013.01); *H01L 22/12* (2013.01); *H01L 2221/68327* (2013.01)

(56) References Cited

U.S. PATENT DOCUMENTS

| | | | | |
|---|---|---|---|---|
| 5,597,767 A * | 1/1997 | Mignardi | ............ | B81C 1/00873 148/DIG. 12 |
| 6,686,291 B1 * | 2/2004 | Hortaleza | ............ | B81C 1/00896 438/107 |
| 2002/0110944 A1 * | 8/2002 | Kian | ................ | H01L 29/78603 438/30 |
| 2006/0043364 A1 * | 3/2006 | Jiang | .................. | H01L 23/3114 257/48 |
| 2006/0079024 A1 * | 4/2006 | Akram | .................. | B28D 1/221 438/110 |
| 2006/0105544 A1 * | 5/2006 | Takanashi | ................ | C09D 5/32 438/460 |
| 2007/0082443 A1 * | 4/2007 | Yamazaki | ............... | H01L 27/12 438/244 |
| 2008/0268619 A1 * | 10/2008 | Nakamura | ............. | B23K 26/18 438/463 |
| 2010/0013036 A1 * | 1/2010 | Carey | .................... | H01L 21/268 257/431 |
| 2011/0266656 A1 * | 11/2011 | Yun | ........................ | H01L 21/561 257/620 |
| 2012/0322238 A1 * | 12/2012 | Lei | .......................... | H01L 21/78 438/462 |
| 2013/0115756 A1 * | 5/2013 | Sekiya | ..................... | H01L 21/78 438/463 |
| 2013/0248118 A1 * | 9/2013 | Inui | ........................ | C09J 133/04 156/701 |
| 2014/0015109 A1 * | 1/2014 | Lei | .......................... | H01L 21/78 257/618 |
| 2014/0057414 A1 * | 2/2014 | Iyer | ........................ | H01L 21/78 438/462 |
| 2014/0295646 A1 * | 10/2014 | Shinoda | ............ | H01L 21/6836 438/464 |
| 2015/0011073 A1 * | 1/2015 | Lei | .......................... | G06T 7/001 382/141 |
| 2015/0104930 A1 * | 4/2015 | Aikawa | .................... | H01L 21/78 438/462 |
| 2016/0125591 A1 * | 5/2016 | Kudo | ...................... | G06T 7/001 382/141 |
| 2016/0172312 A1 * | 6/2016 | Nakamura | ............... | H01L 21/78 438/462 |
| 2016/0266037 A1 * | 9/2016 | Ryo | ........................ | G01N 21/55 |
| 2016/0307851 A1 * | 10/2016 | Ohura | ..................... | H01L 21/78 |
| 2018/0158691 A1 * | 6/2018 | Yokoi | ..................... | H01L 21/304 |

* cited by examiner

WAFER PROCESSING METHOD FOR REFORMING PROTECTIVE FILM

BACKGROUND OF THE INVENTION

Field of the Invention

The present invention relates to a wafer processing method in which a wafer on which a device is formed in each of plural regions marked out by plural streets formed in a lattice manner in a functional layer stacked on a surface of a substrate is divided into chips along the streets.

Description of the Related Art

In a manufacturing process of a semiconductor device, a functional layer in which an insulating film and a functional film are stacked is provided on a surface of a substrate of silicon or the like to form a wafer, and plural devices marked out by streets in a lattice manner are formed on the functional layer. Then, the wafer is divided along the streets to obtain the plural devices. When cutting processing with use of a cutting blade is carried out in dividing of the wafer, possibly delamination of the functional layer (film peeling) occurs in a region other than the regions along the dividing lines on the streets due to difference in properties between the substrate and the functional layer and so forth. For example, a Low-K film (low dielectric constant insulator coat), which is typical as the functional layer, is fragile compared with the substrate and thus film peeling readily occurs in dividing with use of a cutting blade.

As a countermeasure thereagainst, a technique has been proposed in which a protective film is formed over a surface of a wafer and the wafer is irradiated with a laser beam along streets to carry out laser ablation and remove a functional layer such as a Low-K film and part of a substrate (for example, Japanese Patent Laid-Open No. 2015-79790). Adhesion of debris generated by the laser ablation to devices is prevented by the protective film. The protective film is removed after the laser ablation and the wafer is divided into plural devices along the streets by using a cutting blade.

SUMMARY OF THE INVENTION

When laser ablation along streets is carried out for a wafer as in Japanese Patent Laid-Open No. 2015-79790, damage is imposed on a substrate due to heat input from the laser beam. In this case, when cutting processing is carried out in the next dividing step, possibly a crack (sidewall crack) is caused in a side surface of the street on the substrate with the damage being the point of origin. As a countermeasure thereagainst, a technique in which plasma treatment (irradiation) is carried out for a wafer after laser irradiation to remove damage due to the laser irradiation is known.

It is preferable to carry out the plasma irradiation in the state in which the wafer surface (particularly device regions) excluding the street region is coated with the protective film in order to prevent damage to the devices on the wafer due to the plasma irradiation. However, in some cases, in laser ablation, plasma is generated due to the laser irradiation and the protective film is partly broken at a part other than the street region. When the plasma irradiation is carried out for the wafer in this state, possibly damage is given to the devices.

Thus, an object of the present invention is to provide a wafer processing method that allows plasma irradiation in the state in which device regions in a wafer surface are covered by a protective film and can suppress damage to devices.

In accordance with an aspect of the present invention, there is provided a wafer processing method in which a wafer on which a device is formed in each of a plurality of regions marked out by a plurality of streets formed in a lattice manner in a functional layer stacked on a surface of a substrate is divided along the streets. The wafer processing method includes a protective film forming step of supplying a water-soluble resin to a surface of the wafer and forming a protective film with which whole of the surface of the wafer is coated, a laser beam irradiation step of irradiating the wafer with a laser beam through the protective film along the streets to remove the functional layer and expose the substrate, and a protective film detecting step of detecting whether the regions in which the plurality of devices are formed over the wafer are coated with the protective film after carrying out the laser beam irradiation step. The wafer processing method includes also a protective film re-forming step of forming the protective film again in such a manner that the protective film covers each of the regions in which the plurality of devices are formed if a part that is not coated with the protective film exists in the regions in which the plurality of devices are formed as a result of detection in the protective film detecting step, a plasma irradiation step of carrying out plasma irradiation for the wafer after the protective film re-forming step, and a dividing step of cutting the water along the streets and dividing the wafer into individual chips after the plasma irradiation step.

According to this processing method, even if the protective film in the device regions is partly broken in the laser beam irradiation step, damage to the devices can be suppressed because the plasma irradiation is carried out after the protective film is re-formed to cover each of the plural device regions. Therefore, the devices on the wafer can be properly protected by the protective film in both the laser beam irradiation step and the plasma irradiation step, so that high-quality devices can be obtained.

Preferably, in the protective film re-forming step, after the protective film is removed from the surface of the wafer after the protective film detecting step and the water-soluble resin is supplied to the surface of the wafer, the wafer is irradiated, along the streets, with a laser beam that has output power lower than the laser beam with which the wafer is irradiated in the laser beam irradiation step and is capable of removing only the protective film in the streets, and the substrate at parts of the streets is exposed.

According to the present invention, a wafer processing method in which plasma irradiation is possible in the state in which the device regions in a surface of a wafer are covered by the protective film and damage to the devices can be suppressed can be obtained.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
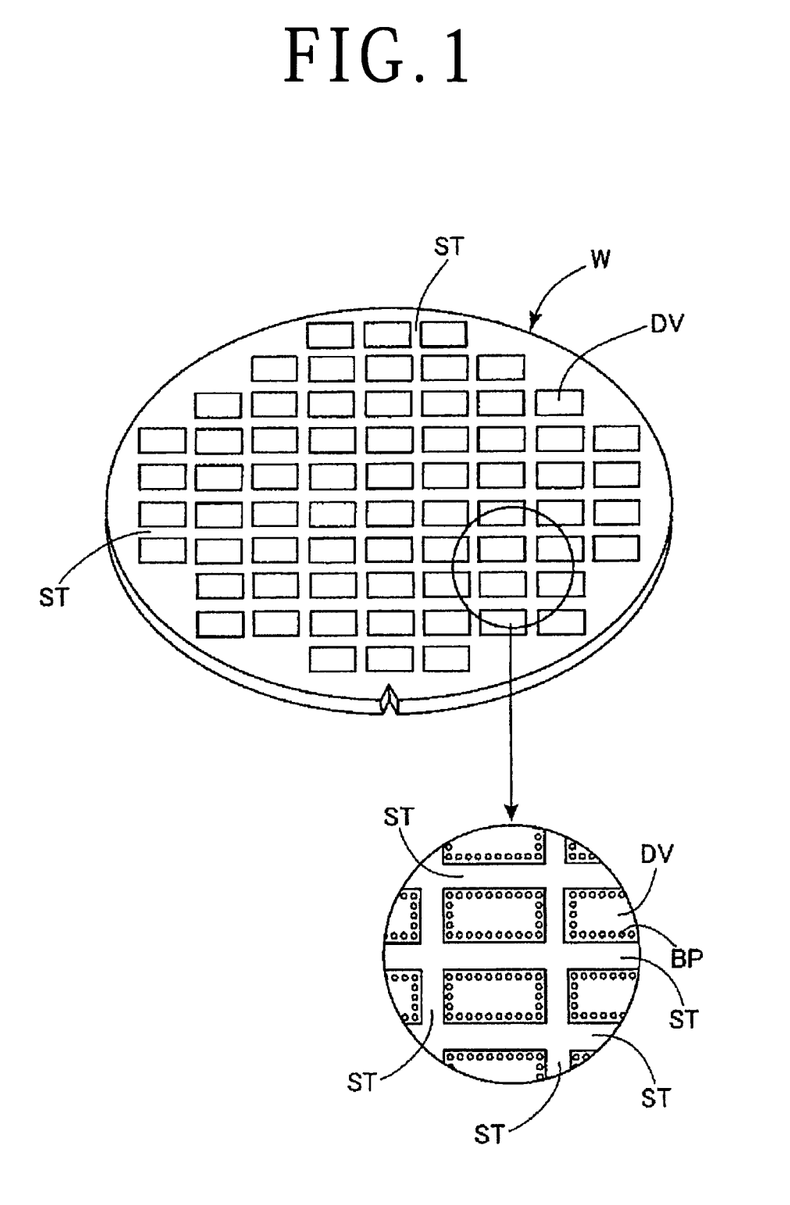
FIG. 1 is a perspective view depicting a wafer to be processed by a wafer processing method according to an embodiment of the present invention.

An embodiment of the present invention will be described below with reference to the accompanying drawings. In FIG. 1, a wafer to be processed by the wafer processing method according to the present invention is depicted. A wafer W depicted in FIG. 1 is a semiconductor wafer containing silicon as the matrix. On the front surface of the wafer W having a circular disc shape, devices DV such as integrated circuits (ICs) and large scale integrations (LSIs) are formed in plural regions marked out in a lattice manner by plural streets ST. As depicted in a circled part in FIG. 1 in an enlarged manner, plural bumps BP (electrodes) that protrude are formed on the front surface of the wafer W at the peripheral edge part of each device DV. As the wafer deemed as a processing target for the present invention, various objects can be employed besides the form depicted in FIG. 1 as long as laser beam irradiation and plasma irradiation to be described later can be carried out for the object. The present invention can be applied to not only semiconductor wafers but also optical device wafers and so forth.

As depicted in FIGS. 5A to 5E, the wafer W has a structure in which a functional layer 72 is stacked on a front surface of a substrate 71 composed of silicon and so forth. The wafer W of the present embodiment includes the functional layer 72 of a double-layer structure. As the functional layer 72, arbitrary objects such as a Low-K film (low dielectric constant insulator coat) and a test element group (TEG) can be selected. Plural bumps BP protrude from a front surface of the functional layer 72.

Subsequently, with reference to FIG. 2, the outline of processing apparatus suitable to carry out the wafer processing method according to the present embodiment will be described. X-axis direction, Y-axis direction, and Z-axis direction to be described below correspond to the directions of arrows depicted in FIG. 2. The X-axis direction and the Y-axis direction are directions along the horizontal plane and the Z-axis direction is an upward-downward direction perpendicular to the horizontal plane.

Figure 2:
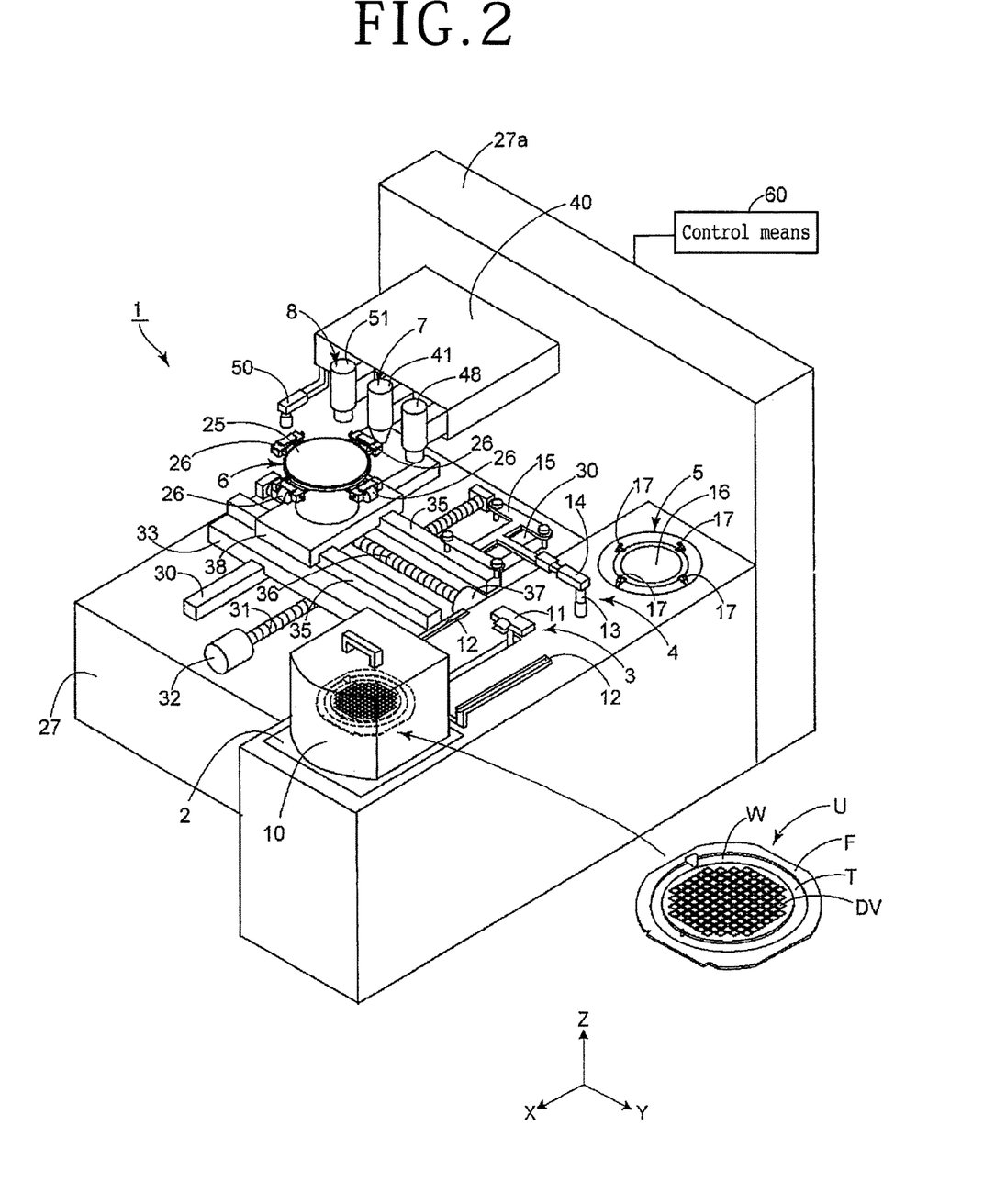
FIG. 2 is a schematic perspective view of processing apparatus suitable to carry out the wafer processing method according to the embodiment.

Laser processing apparatus 1 depicted in FIG. 2 is apparatus that carries the wafer W as a workpiece and irradiates the wafer W with a laser beam along the streets ST (FIG. 1) to carry out laser ablation processing. The ablation refers to the following phenomenon. Specifically, when the irradiation intensity of the laser beam becomes equal to or higher than a predetermined processing threshold, the laser beam is converted to electronic, thermal, photochemical, and mechanical energy at the solid surface. As a result, neutral atoms, molecules, positive and negative ions, radicals, clusters, electrons, and light are explosively discharged and the solid surface is etched.

As depicted in FIG. 2, the wafer W is supported by a frame F with the intermediary of a tape T stuck to the back surface in the state in which the front surface on which the plural devices DV are formed is exposed. What is obtained by supporting the wafer W by the frame F is defined as a wafer unit U.

The laser processing apparatus 1 includes a cassette placement region 2 in which a cassette 10 that houses the wafer unit U is placed, a carrying-out/in mechanism 3 that carries out and in the wafer unit U from and to the cassette 10, a conveying mechanism 4 that conveys the wafer unit U carried out from the cassette 10, protective film forming/removing means 5 that forms and removes a protective film on and from the front surface of the wafer W, a holding table 6 that holds the wafer unit U transferred from the conveying mechanism 4, laser irradiation means 7 that irradiates the wafer W on the holding table 6 with a laser beam, and protective film detecting means 8 that detects the state of the protective film on the front surface of the wafer W on the holding table 6.

Slots (not depicted) at plural stages are formed inside the cassette 10 and the wafer unit U is housed in each slot. The cassette placement region 2 can rise up and lower down in the Z-axis direction (upward-downward direction). Due to the rising and lowering of the cassette placement region 2, a predetermined slot in the cassette 10 can be set to the height position corresponding to the carrying-out/in mechanism 3.

The carrying-out/in mechanism 3 has a grasping part 11 that can move in the X-axis direction and a pair of guide parts 12 that are separate in the Y-axis direction and extend along the X-axis direction. The grasping part 11 can grasp the frame F of the wafer unit U. By moving the grasping part 11 in the X-axis direction in the state in which the grasping part 11 grasps the frame F, the grasping part 11 can be made to carry out operation of drawing the wafer unit U from the inside of the cassette 10 and operation of housing the wafer unit U in the cassette 10. Furthermore, by sandwiching the frame F between the pair of guide parts 12, the position of the wafer unit U in the Y-axis direction can be settled and movement of the wafer unit U in the X-axis direction can be guided.

The conveying mechanism 4 is provided between the carrying-out/in mechanism 3 and the protective film forming/removing means 5. The conveying mechanism 4 includes a revolving shaft 13 that can rotate around an axis line oriented in the Z-axis direction, an extendable arm 14 that extends in the horizontal direction from the upper end of the revolving shaft 13, and a suction adhesion part 15 provided at the tip of the extendable arm 14. The revolving shaft 13 can move upward and downward along the Z-axis direction and the extendable arm 14 can expand and contract in the horizontal direction. By the rotation of the revolving shaft 13 and the extension and contraction of the extendable arm 14, the position of the suction adhesion part 15 in the horizontal plane including the X-axis and the Y-axis changes. By the upward and downward movement of the revolving shaft 13, the position of the suction adhesion part 15 in the Z-axis direction changes. The suction adhesion part 15 can hold the frame F of the wafer unit U by suction from the upper side. By moving the suction adhesion part 15 in the state of holding the wafer unit U in the above-described respective directions, the wafer unit U is conveyed.

The protective film forming/removing means 5 will be described with reference to FIG. 3. The protective film forming/removing means 5 includes a spinner table 16 that holds the lower surface of the wafer unit U by suction and plural (four) clamps 17 that fix the frame F of the wafer unit U on the spinner table 16. The spinner table 16 can rotate around a rotation axis oriented in the Z-axis direction by a rotational drive mechanism 18. The spinner table 16 is surrounded by a frame body 19 having a bottomed circular cylindrical shape and a drain pipe 20 is connected to a drain outlet 19a formed in the bottom of the frame body 19. The spinner table 16 and the rotational drive mechanism 18 are supported movably in the Z-axis direction with the intermediary of a raising/lowering mechanism 21, and the protective film forming/removing means 5 can be set to the state in which the upper surface of the spinner table 16 is located near the upper end part of the frame body 19 (FIG. 2, FIG. 3) and the state in which the spinner table 16 sinks down to the inside of the frame body 19 (is lowered in the frame body 19).

Figure 3:
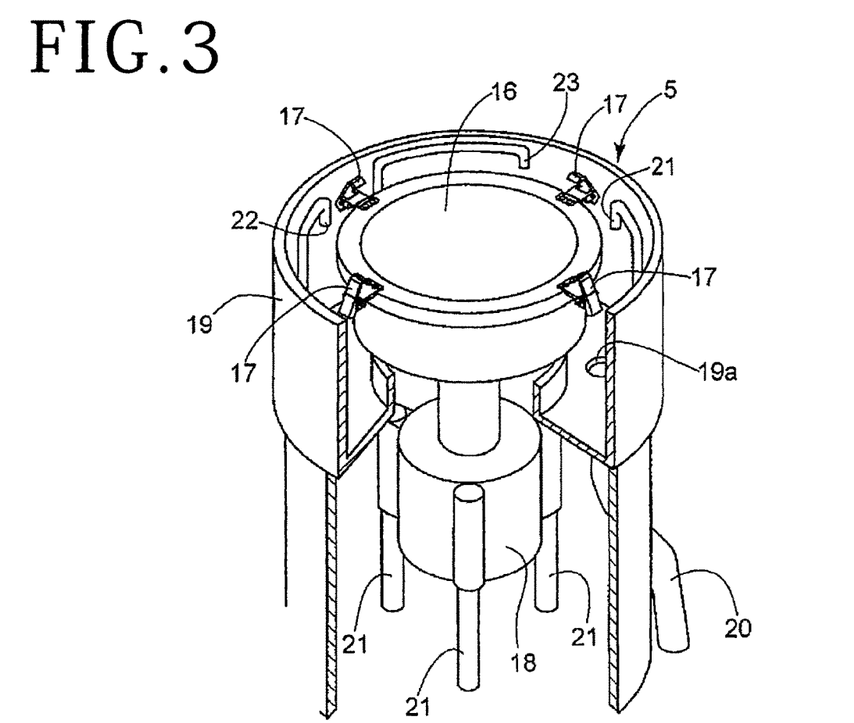
FIG. 3 is a partially-sectional perspective view of protective film forming/removing means that forms the processing apparatus.

As depicted in FIG. 3, in the frame body 19, a resin supply nozzle 21, a water feed nozzle 22, and an air nozzle 23 are provided at positions that surround the spinner table 16. These respective nozzles 21, 22, and 23 are provided at tips of arms that can revolve around an axis oriented in the Z-axis direction. The resin supply nozzle 21 is a nozzle that drops a liquid water-soluble resin to be described later toward the wafer W held on the spinner table 16. The water feed nozzle 22 is a nozzle that supplies cleaning water for protective film removal toward the wafer W held on the spinner table 16. The air nozzle 23 is a nozzle that ejects air toward the wafer W held on the spinner table 16.

Referring back to FIG. 2, the description of the laser processing apparatus 1 will be continued. The holding table 6 includes a suction part 25 that holds the lower surface of the wafer unit U by suction. The suction part 25 includes a holding surface having a circular shape oriented upward and can cause a suction force to act on this holding surface to hold the wafer unit U. Around the suction part 25, plural (four) clamps 26 that fix the frame F of the wafer unit U are provided.

The holding table 6 is supported in such a manner that, relative to a base 27 that supports the whole of the laser processing apparatus 1, the holding table 6 can move in the X-axis direction by an X-axis direction drive mechanism and move in the Y-axis direction by a Y-axis direction drive mechanism.

The X-axis direction drive mechanism includes a pair of guide rails 30 that are provided on the base 27 and extend along the X-axis direction, a ball screw 31 that is provided over the base 27 and has a rotation axis oriented in the X-axis direction, and a motor 32 provided at one end of the ball screw 31. A first stage 33 is supported movably in the X-axis direction on the pair of guide rails 30 and a nut that is formed in the first stage 33 and is not depicted in the diagram is screwed to the ball screw 31. Therefore, when the ball screw 31 is rotationally driven by the motor 32, the first stage 33 moves in the X-axis direction on the guide rails 30.

The Y-axis direction drive mechanism includes a pair of guide rails 35 that are provided on the first stage 33 and extend along the Y-axis direction, a ball screw 36 that is provided over the first stage 33 and has a rotation axis oriented in the Y-axis direction, and a motor 37 provided at one end of the ball screw 36. A second stage 38 is supported movably in the Y-axis direction on the pair of guide rails 35 and a nut that is formed in the second stage 38 and is not depicted in the diagram is screwed to the ball screw 36. Therefore, when the ball screw 36 is rotationally driven by the motor 37, the second stage 38 moves in the Y-axis direction on the guide rails 35.

The holding table 6 is supported on the second stage 38. That is, the position of the holding table 6 changes in association with the movement of the first stage 33 in the X-axis direction by the X-axis direction drive mechanism and the movement of the second stage 38 in the Y-axis direction by the Y-axis direction drive mechanism. The laser processing apparatus 1 includes a box-shaped casing 40 that protrudes in the X-axis direction from an upright wall part 27a that protrudes from the upper surface of the base 27, and an irradiation head 41 of the laser irradiation means 7 is provided at the tip part of the casing 40.

Figure 4:
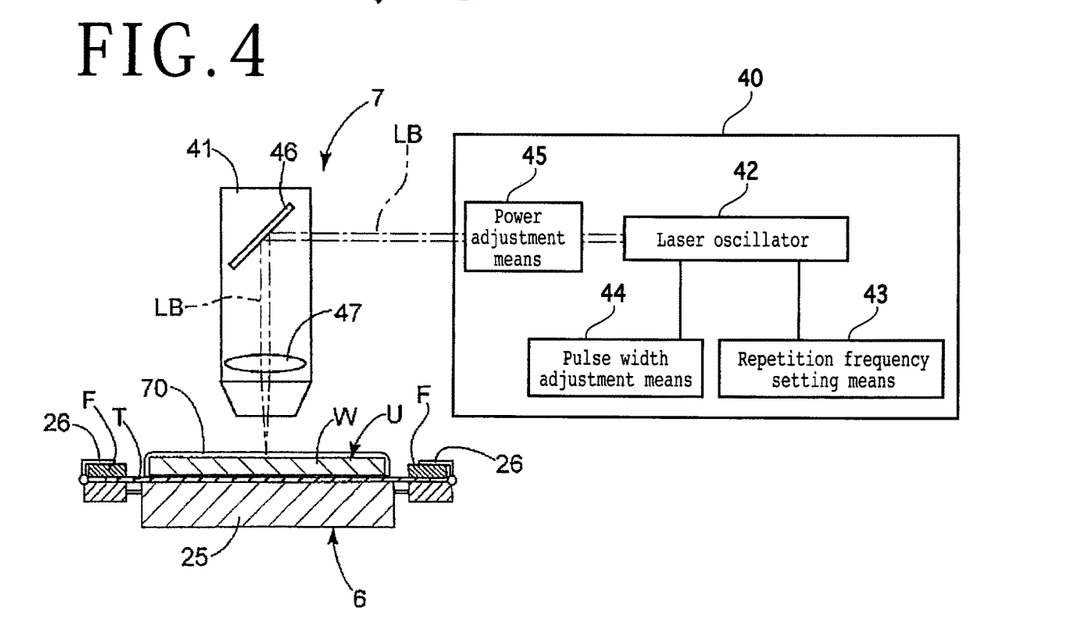
FIG. 4 is a diagram conceptually depicting laser irradiation means that forms the processing apparatus.

The laser irradiation means 7 will be described with reference to FIG. 4. As depicted in FIG. 4, in the casing 40, a laser oscillator 42, repetition frequency setting means 43 and pulse width adjustment means 44 that are annexed to the laser oscillator 42, and power adjustment means 45 are provided. The laser oscillator 42 oscillates a laser beam (pulse laser beam) LB set to predetermined frequency and pulse width by the repetition frequency setting means 43 and the pulse width adjustment means 44. The output power of the laser beam LB is adjusted by the power adjustment means 45.

As depicted in FIG. 4, the laser irradiation means 7 includes a direction conversion mirror 46 and a collecting lens 47 in the irradiation head 41 fixed to the tip part of the casing 40. The laser beam LB that is oscillated from the laser oscillator 42 and is adjusted in the output power by the power adjustment means 45 is subjected to direction conversion toward the lower side by the direction conversion mirror 46 and is collected by the collecting lens 47. The laser irradiation means 7 configured in this manner emits the laser beam LB along an optical axis in the Z-axis direction from the irradiation head 41 toward the wafer W held on the holding table 6.

In the laser processing apparatus 1 depicted in FIG. 2, the configuration is employed in which the holding table 6 is moved in the X-axis direction and the Y-axis direction by the X-axis direction drive mechanism and the Y-axis direction drive mechanism and the laser irradiation means 7 does not move. However, the configuration is not limited to the configuration of FIG. 2 as long as the holding table 6 and the laser irradiation means 7 are in such a relationship as to relatively move in the X-axis direction and the Y-axis direction. For example, a configuration in which the holding table 6 moves only in the Y-axis direction and the laser irradiation means 7 moves in the X-axis direction may be employed.

Referring back to FIG. 2, the description of the laser processing apparatus 1 will be continued. At the tip part of the casing 40, an imaging unit 48 that images the wafer W held on the holding table 6 is provided at a position adjacent to the laser irradiation means 7. The imaging unit 48 is a unit that carries out imaging of a visible light region. By imaging the wafer W by the imaging unit 48 and detecting an image of a target pattern (not depicted) formed on the wafer W, alignment to adjust the position, orientation, and so forth of the wafer W (wafer unit U) based on the target pattern can be carried out.

As depicted in FIG. 2, the protective film detecting means 8 includes an infrared irradiation part 50 and an infrared imaging part 51. The infrared irradiation part 50 is supported movably in the X-axis direction and the Y-axis direction relative to the casing 40 by a drive mechanism, regarding which diagrammatic representation is omitted, and can emit infrared toward the wafer W held on the holding table 6. The infrared imaging part 51 is provided adjacent to the laser irradiation means 7 at the tip part of the casing 40. The infrared imaging part 51 has a light receiving part that can image reflected light of the infrared. The infrared imaging part 51 can image the whole of the wafer W on the holding table 6 at a wide angle of view and acquire an infrared image in the state of being located above the central part of the holding table 6. Protective film detection by the protective film detecting means 8 will be described later.

As depicted in FIG. 2, the laser processing apparatus 1 is provided with control means 60 that carries out overall control of the respective parts of the apparatus. The control means 60 is formed of a processor that executes various kinds of processing. A detection result from the protective film detecting means 8 and so forth are input to the control means 60.

To carry out the wafer processing method of the embodiment of the present invention, aside from the laser processing apparatus 1 described above, plasma irradiation apparatus that carries out plasma irradiation for the wafer W and cutting apparatus that carries out cutting processing of the wafer W along the streets ST to divide the wafer W into the individual devices DV are used.

Figure 5A:
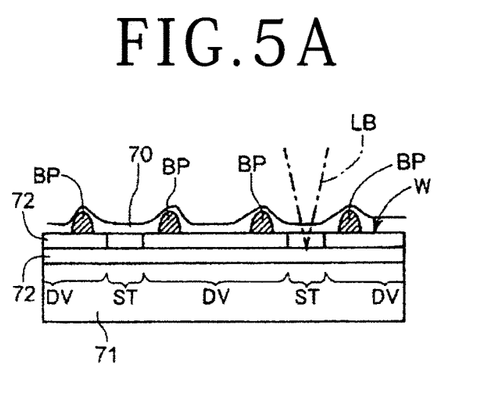
FIGS. 5A to 5E are schematic diagrams depicting the respective steps of the wafer processing method according to the embodiment.
Figure 5B:
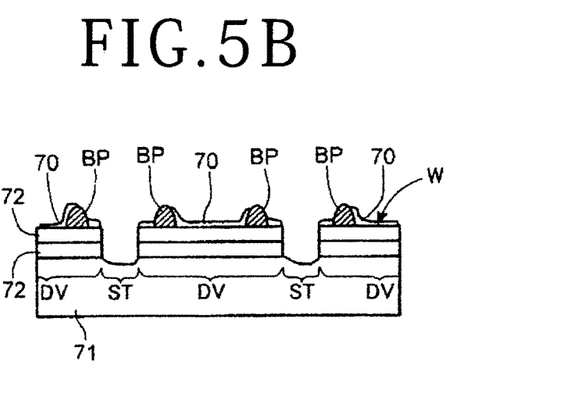
Figure 5C:
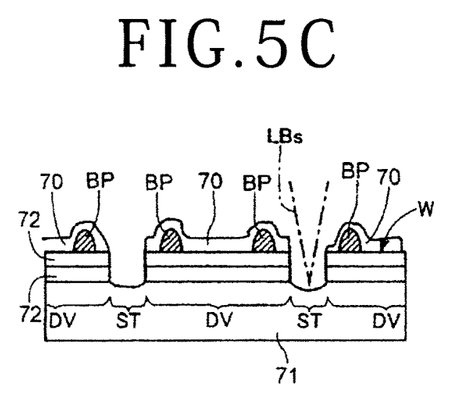
Figure 5D:
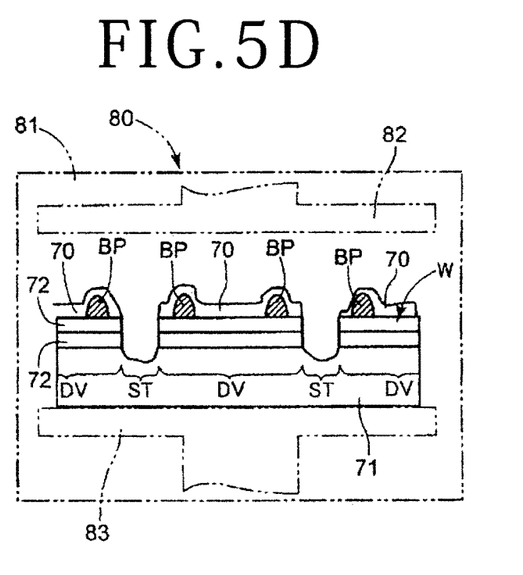

The plasma irradiation apparatus is conceptually depicted in FIG. 5D. Plasma irradiation apparatus 80 depicted in FIG. 5D includes an apparatus housing 81 that internally forms a hermetically-sealed space, and an upper electrode 82 and a lower electrode 83 are provided opposed to each other in the upward-downward direction in the apparatus housing 81. A high frequency voltage can be applied between the upper electrode 82 and the lower electrode 83 by using high frequency voltage applying means, which is not depicted in the diagram. Furthermore, the upper electrode 82 has plural gas ejection ports on the lower surface side opposed to the lower electrode 83 and can eject a gas for conversion to plasma supplied from gas supply means, which is not depicted in the diagram, from the gas ejection ports. The lower electrode 83 has a holding part on which the wafer W is placed to be held. When the high frequency voltage is applied between the upper electrode 82 and the lower electrode 83 by the high frequency voltage applying means in the state in which the gas for conversion to plasma is supplied from the ejection ports of the upper electrode 82, the gas for conversion to plasma is converted to plasma and active substances converted to the plasma act on the wafer W on the lower electrode 83.

Figure 5E:
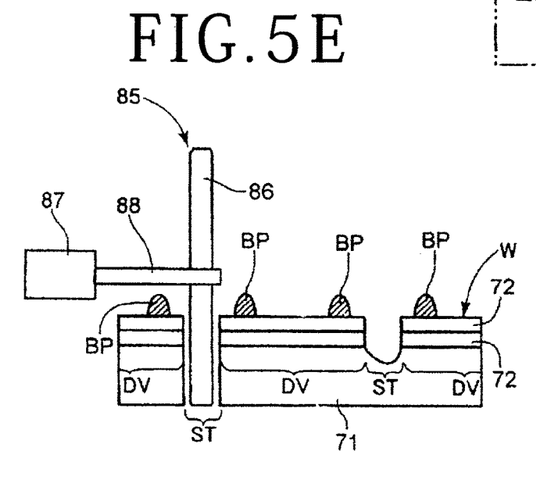

The cutting apparatus is conceptually depicted in FIG. 5E. Cutting apparatus 85 depicted in FIG. 5E includes a holding part that holds the wafer W by suction and a cutting blade 86 having a circular disc shape with which cutting processing for the wafer W held on the holding part is carried out. The cutting blade 86 is rotationally driven by a motor 87 around a rotating shaft 88 that extends in parallel to the plate surface of the wafer W. A drive mechanism that changes the position of the cutting blade 86 relative to the wafer W is provided although diagrammatic representation is omitted. By moving the cutting blade 86 while rotating it, cutting processing of the wafer W can be carried out along the street ST.

Subsequently, the wafer processing method according to the present embodiment will be described. In a rough classification, this processing method includes a protective film forming step and a laser beam irradiation step depicted in FIG. 5A, a protective film detecting step depicted in FIG. 5B, a protective film re-forming step depicted in FIG. 5C, a plasma irradiation step depicted in FIG. 5D, and a dividing step depicted in FIG. 5E.

In the laser processing apparatus 1 depicted in FIG. 2, the wafer unit U housed in the cassette 10 is drawn from the cassette 10, with the frame F clamped by the grasping part 11 of the carrying-out/in mechanism 3. The wafer unit U is positioned by the guide parts 12 and then is carried to the protective film forming/removing means 5 by the conveying mechanism 4, and the protective film forming step is carried out.

In the protective film forming step in the protective film forming/removing means 5 (see FIG. 3), the wafer unit U is placed on the spinner table 16 and the frame F is fixed by the clamps 17 in the state in which the front surface of the wafer W is oriented upward. Then, in the state in which the spinner table 16 is lowered in the Z-axis direction and is housed in the frame body 19, the spinner table 16 is rotated by the rotational drive mechanism 18 while a liquid resin is dropped from the resin supply nozzle 21 to the front surface of the wafer W (near the center). Along with this, the liquid resin spreads toward the peripheral edge part of the wafer W due to a centrifugal force and a protective film 70 (see FIG. 5A) with which the whole surface of the wafer W is coated is formed.

The liquid resin for forming the protective film 70 is a water-soluble resin. For example, polyvinyl alcohol (PVA), polyvinylpyrrolidone (PVP), polyethylene glycol (PEG), and so forth can be used. In order to enhance the absorbability of the laser beam LB emitted from the laser irradiation means 7 in the later laser irradiation step, in the water-soluble resin to form the protective film 70, an absorbent such as ferulic acid may be added or fine particles of a transition metal oxide such as titanium oxide ($TiO_2$) may be dispersed. It is preferable to set the fine particles of a transition metal oxide to a size of 1 nm to approximately several tens of nanometers. The material and additive of the protective film 70 are not limited to the above-described examples and can be selected as appropriate according to the wavelength region of the laser beam that is used, and so forth.

After the protective film forming step (forming of the protective film 70 on the front surface of the wafer W in the protective film forming/removing means 5) is completed, the wafer unit U is conveyed to the holding table 6 by the conveying mechanism 4. At the holding table 6, the wafer unit U is sucked by the suction part 25 and the frame F is fixed by the clamps 26. Then, the motor 37 of the Y-axis direction drive mechanism is driven and the holding table 6 is moved in the Y-axis direction to convey the wafer unit U to the lower side of the laser irradiation means 7.

Subsequently, the wafer W on the holding table 6 is imaged by using the imaging unit 48 and alignment to adjust the position, orientation, and so forth of the wafer unit U relative to the laser irradiation means 7 is carried out with reference to a target pattern on the wafer W.

Before the laser irradiation step is carried out, whether or not the whole of the front surface of the wafer W is coated with the protective film 70 is detected. The protective film detecting step before this laser irradiation is carried out by using the protective film detecting means 8 depicted in FIG. 2. The protective film detecting means 8 irradiates the front surface of the wafer W with infrared from the infrared irradiation part 50 and receives reflected light of the infrared from the front surface of the wafer W by the infrared imaging part 51 to carry out imaging. The infrared irradiation part 50 can irradiate the whole of the front surface of the wafer W with the infrared while moving in the X-axis direction and the Y-axis direction and the infrared imaging part 51 can image the whole of the front surface of the wafer W at a wide angle of view. Thus, an infrared image of the whole of the front surface of the wafer W can be acquired by using the infrared irradiation part 50 and the infrared imaging part 51.

The protective film 70 has a high absorptance (low reflectance) of the infrared compared with the devices DV (including the bumps BP) formed on the front surface of the wafer W. For this reason, if a part that is not coated with the protective film 70 exists in the front surface of the wafer W, a region in which the protective film 70 exists and the infrared reflection is low and a region that is not coated with the protective film 70 and yields high infrared reflection are included in the infrared image acquired by the infrared imaging part 51. The protective film detecting means 8 executes image processing based on the difference in the intensity of light (contrast) between these regions and can detect the region that is not coated with the protective film 70 in the front surface of the wafer W. The holding table 6 for laser processing tightly holds the wafer unit U by using the suction part 25 and the clamps 26. Thus, it is difficult for vibrations and so forth of the wafer unit U to occur and the state of the protective film 70 can be detected with high detection accuracy.

If it is detected that the whole of the front surface of the wafer W is not coated with the protective film 70 in the detecting step before laser beam irradiation, instead of proceeding to the laser beam irradiation step, the wafer unit U is returned to the protective film forming/removing means 5 and the above-described protective film forming step is carried out.

If it is confirmed that the whole of the front surface of the wafer W is coated with the protective film 70 in the detecting step before laser beam irradiation, the laser beam irradiation step is carried out. In the laser beam irradiation step, laser beam irradiation from the laser irradiation means 7 is carried out while the wafer W is moved by using the X-axis direction drive mechanism and the Y-axis direction drive mechanism, so that laser ablation is carried out along the streets ST of the wafer W. For example, for the streets ST that extend along the Y-axis direction, the laser beam irradiation is carried out with processing feed of the wafer W in the Y-axis direction by the Y-axis direction drive mechanism. For the streets ST that extend along the X-axis direction, the laser beam irradiation is carried out with processing feed of the wafer W in the X-axis direction by the X-axis direction drive mechanism.

FIG. 5A is a diagram depicting the laser beam irradiation step for laser ablation. The wafer W is irradiated with the laser beam LB emitted from the laser irradiation means 7 along the streets ST of the wafer W. The laser beam LB is transmitted through the protective film 70 with which the front surface of the wafer W is coated, and is focused on the front surface of the wafer W, so that the functional layer 72 on the street ST and part of the substrate 71 under it are removed (see FIG. 5B). That is, a laser-processed groove is formed above the street ST. At this time, even when debris is generated due to concentration of thermal energy in the removal of the functional layer 72 and the substrate 71, adhesion of the debris to the front surface of the wafer W is prevented by the protective film 70 and quality lowering of the devices DV due to the adhesion of the debris can be prevented. In particular, in the wafer W of the present embodiment, the plural minute bumps BP are formed on the devices DV and removal of debris is difficult once the debris adheres to the devices DV. Therefore, the prevention of debris adhesion by the protective film 70 is extremely effective.

Incidentally, in the laser beam irradiation step, there is a possibility that the protective film 70 is broken in a region other than the streets ST, which are the target of the laser ablation, due to causes such as effect of plasma generated by the irradiation with the laser beam LB. FIG. 5B depicts the state in which the protective film 70 that covers the regions of the devices DV is partly broken, and the bumps BP are exposed from the parts at which the protective film 70 is broken. Although the bumps BP are depicted as an example of the exposed part in FIG. 5B, there is also the case in which the front surface part of the wafer W other than the bumps BP is exposed depending on the breakage situation of the protective film 70.

After the laser beam irradiation step depicted in FIG. 5A, the protective film detecting step of detecting whether or not breakage of the protective film 70 like that depicted in FIG. 5B has occurred is carried out. The protective film detecting step after the laser beam irradiation is carried out by using the protective film detecting means 8 depicted in FIG. 2 as with the above-described protective film detecting step before the laser beam irradiation. Specifically, the front surface of the wafer W is irradiated with infrared from the infrared irradiation part 50 and reflected light of the infrared from the front surface of the wafer W is received by the infrared imaging part 51 to carry out imaging, so that an infrared image of the whole of the front surface of the wafer W is acquired. This infrared image is subjected to image processing and the region in which the protective film 70 exists and the infrared reflection is low and the region that is not coated with the protective film 70 and yields high infrared reflection are discriminated. In the protective film detecting step after the laser beam irradiation, whether or not a part that is not coated with the protective film 70 exists is detected particularly regarding the region of each device DV excluding the streets ST in the front surface of the wafer W. Similarly to the protective film detecting step before the laser beam irradiation, the detecting step is carried out with the wafer unit U tightly held by the holding table 6 for laser processing and thus the state of the protective film 70 can be detected with high accuracy.

Detection data of the coating state of the protective film 70 acquired in the protective film detecting step after the laser beam irradiation is transmitted to the control means 60 (FIG. 2). If it is detected that all of the regions of the respective devices DV of the wafer W are covered by the protective film 70 (breakage of the protective film 70 has not occurred) based on this detection data, the control means 60 causes the plasma irradiation step to be described later to be carried out. On the other hand, if it is detected that a part that is not coated with the protective film 70 exists in the regions of the respective devices DV of the wafer W, the control means 60 causes the protective film re-forming step to be described next to be carried out.

In the protective film re-forming step, the wafer unit U is conveyed from the holding table 6 to the protective film forming/removing means 5. In the protective film forming/removing means 5, cleaning water is supplied from the water feed nozzle 22 toward the front surface of the wafer W and the protective film 70 left on the front surface of the wafer W is removed. Because being formed of the water-soluble resin, the protective film 70 can be easily washed away by the cleaning water. At this time, debris generated in the previous laser beam irradiation step is also washed away together with the protective film 70. The cleaning water is drained from the drain outlet 19a in the bottom of the frame body 19 through the drain pipe 20. After the completion of the cleaning, air is ejected from the air nozzle 23 to remove water droplets left on the wafer W.

Subsequently, re-forming of the protective film 70 on the front surface of the wafer W is carried out. Similarly to the above-described protective film forming step, by dropping the water-soluble liquid resin onto the front surface of the wafer W and rotating the spinner table 16, the protective film 70 with which the front surface of the wafer W is coated across the board is re-formed. The protective film 70 re-formed by using the protective film forming/removing means 5 becomes such a form as to coat not only the region of each device DV but also the regions on the streets ST in the front surface of the wafer W.

In the protective film re-forming step, furthermore the wafer unit U in the state in which the protective film 70 has been re-formed on the whole of the front surface of the wafer W is conveyed from the protective film forming/removing means 5 to the holding table 6. Then, as depicted in FIG. 5C, a laser beam LBs is emitted from the laser irradiation means 7 and only the part re-formed on the streets ST in the protective film 70 is removed by laser ablation. The output power of the laser beam LBs emitted at this time is set by the power adjustment means 45 in such a manner that the output power of the laser beam LBs becomes lower than that of the laser beam LB emitted in the previous laser beam irradiation step. Specifically, the laser beam LBs is set to output power with which only the protective film 70 in the streets ST can be removed without breaking the substrate 71 and the functional layer 72 and without generating plasma that will become a cause of breakage of the protective film 70 that covers the regions of the devices DV.

After the irradiation with the laser beam LBs, the above-described protective film detecting step is carried out again by using the protective film detecting means 8 and whether the whole of the region of each device DV of the wafer W is coated with the protective film 70 (and whether the protective film 70 on the streets ST has been removed) is detected. If breakage of the protective film 70 in the region of the device DV is detected, the protective film re-forming step is carried out again according to need. The degree of breakage of the protective film 70 (threshold of detection) over which it is detected that the protective film re-forming step is necessary can be arbitrarily set.

Through the above respective steps, as depicted in FIG. 5C, the wafer W in the state in which the front surface of the substrate 71 is exposed without being covered by the protective film 70 at the part of the streets ST and the whole of the regions of the plural devices DV is covered by the protective film 70 is obtained. If it is detected that breakage of the protective film 70 in the region of each device DV does not exist in the first round of the protective film detecting step (before which the protective film re-forming step has not been carried out) after the laser beam irradiation, the wafer W in the coating state depicted in FIG. 5C has been obtained.

Subsequently, the plasma irradiation step depicted in FIG. 5D is carried out. In the plasma irradiation step, the wafer W in the state in which the region of each device DV is covered by the protective film 70 is conveyed from the laser processing apparatus 1 to the plasma irradiation apparatus 80. In the plasma irradiation apparatus 80, the wafer W is held on the holding part of the lower electrode 83 in the apparatus housing 81 and the gas supply means (not depicted) is operated to eject the gas for conversion to plasma from plural ejection ports of the upper electrode 82 toward the wafer W. In the state in which the gas for conversion to plasma is supplied in this manner, a high frequency voltage is applied between the upper electrode 82 and the lower electrode 83 from the high frequency voltage applying means (not depicted). Along with this, the gas for conversion to plasma is converted to plasma, so that the plasma is generated in the space between the upper electrode 82 and the lower electrode 83. Active substances generated due to the plasma act on the places of the exposed streets ST in the wafer W and the inside of the streets ST is modified (edging) to remove damage due to the previous laser beam irradiation. At this time, because each device DV is coated with the protective film 70, damage to the devices DV due to the plasma irradiation can be suppressed.

After the completion of the plasma irradiation step, the protective film 70 on the wafer W is removed. The removal of the protective film 70 can be carried out by conveying the wafer W (wafer unit U) to the spinner table 16 of the protective film forming/removing means 5 and supplying the cleaning water from the water feed nozzle 22 toward the front surface of the wafer W. Alternatively, the protective film 70 may be removed by using cleaning means other than the protective film forming/removing means 5.

After the removal of the protective film 70, the dividing step depicted in FIG. 5E is carried out. The dividing step is carried out after the wafer W is conveyed to the cutting apparatus 85. In the cutting apparatus 85, the wafer W is held on the holding part by suction and the position of the cutting blade 86 is aligned with the street ST. Then, the substrate 71 is cut by relatively moving the cutting blade 86 and the wafer W in the forming direction of each street ST while rotating the cutting blade 86 by the motor 87, and the wafer W is divided into the plural devices DV.

Because the functional layer 72 on the streets ST has been already removed by laser ablation (laser beam irradiation step) depicted in FIG. 5A, film peeling of the functional layer 72 occurs less readily in the cutting processing in the dividing step. Furthermore, because the inside of each street ST of the wafer W (inner surfaces of laser-processed grooves) has been modified due to plasma edging by the plasma irradiation step depicted in FIG. 5D, the occurrence of cracks (sidewall cracks) in the side surface part of each street ST can be suppressed in the cutting processing in the dividing step.

As described above, according to the wafer processing method of the present embodiment, after the wafer W is irradiated with a laser beam along the streets ST of the wafer W to carry out laser ablation, the coating state of the protective film 70 on the wafer W is detected and the protective film 70 is re-formed in the forming regions of the devices DV if a part that is not coated with the protective film 70 exists in the forming regions of the devices DV. For this reason, the forming regions of the devices DV can be surely protected by the protective film 70 in the plasma irradiation step for modifying the inner surfaces of the streets ST. Furthermore, in the dividing step of the wafer W carried out subsequently to the plasma irradiation step, film peeling of the functional layer 72 is prevented and the occurrence of sidewall cracks in the streets ST can be suppressed.

The present invention is not limited to the above-described embodiment and can be carried out with various changes. In the above-described embodiment, the size, shape, and so forth of each constituent element are not limited to size, shape, and so forth diagrammatically represented in the accompanying drawings and can be changed as appropriate within such a range as to exert effects of the present invention.

For example, in the protective film re-forming step, instead of forming the protective film 70 on the whole of the front surface of the wafer W including the streets ST as in the above-described embodiment, only the place at which the protective film 70 does not exist (has been broken) in the regions of the devices DV may be regarded as the target and the protective film 70 may be re-formed in a spot manner. Specifically, the position of an uncoated part at which the protective film 70 does not exist on the device DV is recognized from image information of an infrared image of the wafer W acquired by the protective film detecting means 8, and the position information is stored in a storing unit included in the control means 60 (FIG. 2) or the like. Then, by using protective film re-forming means that can selectively supply a water-soluble resin to a minute region as in an inkjet system, the water-soluble resin is supplied only to the uncoated part on the device DV to re-form the protective film based on the position information stored in the storing unit. According to this protective film re-forming method, the re-irradiation with the laser beam LBs depicted in FIG. 5C (laser irradiation for removing the protective film 70 on the streets ST) can be omitted.

The protective film detecting means 8 of the above-described embodiment is means that acquires an infrared image and detects the coating state of the protective film 70. However, the means for protective film detection may be means other than it. As one example, whether or not the protective film exists may be detected by irradiating the front surface of a wafer with excitation light with a wavelength other than that of infrared and detecting fluorescence from the protective film. If the wavelength of the laser for processing used in laser ablation is in the ultraviolet region, excitation light with the wavelength of ultraviolet can be used.

As another different form of the protective film detecting means, it is also possible to spray water vapor on the front surface of a wafer and detect coated region and uncoated region of a protective film based on the scattering situation of light. The protective film composed of a water-soluble resin has hydrophilicity. Therefore, when the water vapor adheres to the protective film, the water vapor is not left as water droplets on the protective film. On the other hand, recesses and projections based on water droplets are formed in the uncoated region, in which the protective film does not exist. In this case, a difference in the intensity of light is caused between the place at which scattering of light due to the recesses and projections of water droplets is caused (uncoated region) and the place at which scattering of light is not caused (coated region). Thus, whether or not the protective film exists can be detected by imaging the front surface of the wafer and obtaining image information.

Furthermore, although the embodiment of the present invention is described, what are obtained by combining the above-described embodiment and modification examples totally or partially may also be employed as other embodiments of the present invention.

Furthermore, embodiments of the present invention are not limited to the above-described embodiment and may be variously changed, replaced, and modified without departing from the gist of technical ideas of the present invention. Moreover, if technical ideas of the present invention can be implemented in another way based on advancement in a technique or another technique that is derived, the present invention may be carried out by using the method. Therefore, the scope of claims covers all modes for carrying out the invention that can be included in the range of technical ideas of the present invention.

As described above, the present invention has an effect that plasma irradiation is possible in the state in which the device regions in the front surface of the wafer are covered by the protective film and damage to the devices can be suppressed even if an uncoated part of the protective film is generated in a region other than the streets in the laser beam irradiation step. In particular, the present invention is useful for a wafer processing method in which plural devices are divided along streets compartmentally formed in the front surface of a substrate.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method in which a wafer on which a device is formed in each of a plurality of regions marked out by a plurality of streets formed in a lattice manner in a functional layer stacked on a surface of a substrate is divided along the streets, the wafer processing method comprising:
   a protective film forming step of supplying a water-soluble resin to a surface of the wafer and forming a protective film that coats the entirety of the surface of the wafer;
   a laser beam irradiation step of irradiating the wafer with a laser beam through the protective film along the streets to remove the functional layer and expose the substrate;
   a protective film detecting step of detecting whether the regions in which the plurality of devices are formed over the wafer are coated with the protective film after carrying out the laser beam irradiation step, said protective film detecting step including irradiating the surface of the wafer with infrared light and receiving reflected infrared light from the surface of the wafer, wherein regions coated with the protective film have a first amount of the reflected infrared light, and regions that are not coated with the protective film have a second amount of the reflected infrared light, wherein the second amount of the reflected infrared light is greater than the first amount of the reflected infrared light;
   a protective film re-forming step that is performed when a part that is not coated with the protective film exists in the regions in which the plurality of devices are formed as a result of the protective film detecting step, wherein the protective film re-forming step includes removing the protective film remaining on the surface of the wafer, and supplying the water-soluble resin to the surface of the wafer and re-forming the protective film that coats the entirety of the surface of the wafer;
   a plasma irradiation step of carrying out plasma irradiation for the wafer after the protective film re-forming step; and
   a dividing step of cutting the wafer along the streets and dividing the wafer into individual chips after the plasma irradiation step.

2. The wafer processing method according to claim 1, wherein in the protective film re-forming step, after the protective film is removed from the surface of the wafer after the protective film detecting step and the water-soluble resin is supplied to the surface of the wafer, the wafer is irradiated, along the streets, with a laser beam that has output power lower than the laser beam with which the wafer is irradiated in the laser beam irradiation step and is capable of removing only the protective film in the streets, and the substrate at parts of the streets is exposed.

3. The wafer processing method according to claim 1, further comprising forming a plurality of bumps on a surface of the functional layer prior to the protective film forming step.

4. The wafer processing method according to claim 1, the protective film forming step including:
   spinning the wafer on a table; and
   applying the water-soluble resin to the surface of the wafer.

5. The wafer processing method according to claim 1, wherein in the protective film re-forming step, the protective film is removed from the wafer by applying cleaning water to the surface of the wafer, and directing air onto the surface of the wafer.

6. The wafer processing method according to claim 1, wherein the protective film has a higher absorptance of the infrared light than the plurality of devices.

7. The wafer processing method according to claim 1, wherein the protective film includes ferulic acid.

8. The wafer processing method according to claim 1, wherein the protective film includes metal oxide particles.

\* \* \* \* \*